(12) United States Patent
Hirohata et al.

(10) Patent No.: US 9,772,359 B2
(45) Date of Patent: Sep. 26, 2017

(54) SEMICONDUCTOR MODULE

(71) Applicant: Kabushiki Kaisha Toshiba, Minato-ku (JP)

(72) Inventors: Kenji Hirohata, Tokyo (JP); Minoru Mukai, Tokyo (JP); Tomoko Monda, Kanagawa-ken (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/501,995

(22) Filed: Sep. 30, 2014

(65) Prior Publication Data
US 2015/0019150 A1 Jan. 15, 2015

Related U.S. Application Data

(63) Continuation of application No. 13/429,762, filed on Mar. 26, 2012, now Pat. No. 8,884,634.

(30) Foreign Application Priority Data

Mar. 28, 2011 (JP) .................................. 2011-069144

(51) Int. Cl.
*G01R 31/26* (2014.01)
*H01L 23/31* (2006.01)
(Continued)

(52) U.S. Cl.
CPC .............. *G01R 27/16* (2013.01); *H01L 23/64* (2013.01); *H01L 2924/0002* (2013.01)

(58) Field of Classification Search
CPC . G01R 27/16; H01L 23/64; H01L 2924/0002; H01L 2224/45015;
(Continued)

(56) References Cited

U.S. PATENT DOCUMENTS 6,281,580 B1 * 8/2001 Ise ........................ H01L 23/16
257/734
6,281,697 B1 * 8/2001 Masuda ............... G01R 31/315
324/263
(Continued)

FOREIGN PATENT DOCUMENTS

JP 2005-322768 A 11/2005
JP 2006-278946 A 10/2006
(Continued)

OTHER PUBLICATIONS

Akira—JP 2008-147245 Machine Translation by JPO, p. 1-18.*
(Continued)

*Primary Examiner* — Jermele M Hollington
*Assistant Examiner* — Taqi Nasir
(74) *Attorney, Agent, or Firm* — Oblon, McClelland, Maier & Neustadt, L.L.P.

(57) ABSTRACT

According to one embodiment, a semiconductor module comprises a substrate, a first wiring, an electrode pad, a junction, an oscillator, and a detector. The first wiring is disposed on the substrate, and has a characteristic impedance Z0. The electrode pad is connected to the first wiring. The junction is disposed on the electrode pad, and has an impedance Z1. The oscillator is disposed in contact with the first wiring, and oscillates a pulse wave of a voltage toward the junction via the first wiring. The detector is disposed in contact with the first wiring, and detects an output wave of the pulse wave from the junction. The characteristic impedance Z0 and the impedance Z1 satisfy a following relationship (1), $$\left\| \frac{Z0 - Z1}{Z0} \right\| \leq 0.05. \quad (1)$$

8 Claims, 8 Drawing Sheets

(51) Int. Cl.
*G01R 27/16* (2006.01)
*H01L 23/64* (2006.01)

(58) Field of Classification Search
CPC ....... H01L 2924/00; H01L 2924/00014; H01L 22/34; H01L 22/14; H01L 2224/85399; H01L 22/32; H01L 2924/13055; H01L 2224/05624; H01L 22/22; H01L 25/0657
USPC .... 324/676, 760.01–760.02, 752.05, 762.01, 324/762.06–726.09, 719, 754.21, 347, 324/444–449, 358–359
See application file for complete search history.

(56) References Cited

U.S. PATENT DOCUMENTS

| | | | | |
|---|---|---|---|---|
| 6,486,688 | B2* | 11/2002 | Taura | G01R 31/2886 324/754.2 |
| 6,784,684 | B2* | 8/2004 | Tanimura | G01R 31/31924 324/73.1 |
| 6,927,343 | B2* | 8/2005 | Watanabe | G01R 1/07314 174/117 F |
| 7,187,179 | B1* | 3/2007 | Scaman | G01R 31/2884 257/18 |
| 7,653,510 | B2 | 1/2010 | Hirohata et al. | |
| 7,683,627 | B2* | 3/2010 | Tsukuda | G01R 31/2884 324/522 |
| 8,884,634 | B2* | 11/2014 | Hirohata | H01L 23/64 324/663 |
| 2004/0053429 | A1* | 3/2004 | Muranaka | 438/17 |
| 2005/0218397 | A1 | 10/2005 | Tran | |
| 2008/0111575 | A1* | 5/2008 | Ogiwara | G01R 31/3004 324/750.3 |
| 2009/0152595 | A1* | 6/2009 | Kaga | G01R 31/2884 257/208 |

FOREIGN PATENT DOCUMENTS

| | | |
|---|---|---|
| JP | 2008-147245 A | 6/2008 |
| JP | 2010-81796 A | 4/2010 |

OTHER PUBLICATIONS

Tomio—JP 2006-278946 Machine Translation JPO, p. 1-20.*
Ten—JP 2005-322768 Machine Translation JPO, p. 1-19.*
Office Action issued Dec. 12, 2014 in Japanese Patent Application No. 2011-069144 (with English language translation).
Japanese Office Action issued Mar. 16, 2016 in Patent Application No. 2015-088784 (with English Translation).

* cited by examiner

| RATIO OF CRACK AREA (CRACK AREA / JUNCTION SECTION AREA) | VOLTAGE RANGE | COUNT VALUE "Nc" TO DECIDE "CRACK-EXISTENCE" |
|---|---|---|
| 0 (CRASH NON-EXISTENCE) | ~ V0 | |
| ≤ 0.1 | V0 ~ V1 | 30 |
| ≤ 0.2 | V1 ~ V2 | 10 |
| ≤ 0.3 | V2 ~ V3 | 10 |

SEMICONDUCTOR MODULE

CROSS-REFERENCE TO RELATED APPLICATION

This application is a continuation of U.S. Ser. No. 13/429,762 filed Mar. 26, 2012, which is based upon and claims the benefit of priority from Japanese Patent Application No. 2011-069144, filed on Mar. 28, 2011; the entire contents of both of which are incorporated herein by reference.

FIELD

Embodiments described herein relate generally to a semiconductor module.

BACKGROUND

As to an electronic information device such as a power electronics, a solid state drive (SSD) and a personal computer (PC), by measuring an acceleration or a temperature of the electronic information device, research of technique to calculate a performance-drop or a fatigue-degree thereof is advanced. Furthermore, by acquiring information of the electronic information device via a sensor and so on, an apparatus to present a danger degree of occurrence of breakdown for respective component or a main body of the electronic information device is proposed. On the other hand, in a quality control region of hardware, technique to evaluate a probability of breakdown for a manufactured product by monitoring data or repair data thereof is accumulated.

When a crack occurs at a junction of the electronic device or a semiconductor module, a fatigue failure or a migration occurs by spread of the crack. As a result, electrical characteristics or thermal conductivity characteristics thereof becomes under a status of breakdown. Accordingly, before this status, if an indication (sign) of breakdown is detected, a warning can be previously presented to a user. In this case, by backup of electronic device data, switch of operation mode or timely maintenance service, availability of the electronic device can improve.

DETAILED DESCRIPTION

According to one embodiment, a semiconductor module comprises a substrate, a first wiring, an electrode pad, a junction, an oscillator, and a detector. The first wiring is disposed on the substrate, and has a characteristic impedance Z0. The electrode pad is connected to the first wiring. The junction is disposed on the electrode pad, and has an impedance Z1. The oscillator is disposed in contact with the first wiring, and oscillates a pulse wave of a voltage toward the junction via the first wiring. The detector is disposed in contact with the first wiring, and detects an output wave of the pulse wave from the junction. The characteristic impedance Z0 and the impedance Z1 satisfy a following relationship (1), $$\left\| \frac{Z0 - Z1}{Z0} \right\| \leq 0.05. \quad (1)$$

Various embodiments will be described hereinafter with reference to the accompanying drawings.

(The First Embodiment)

Figure 1:
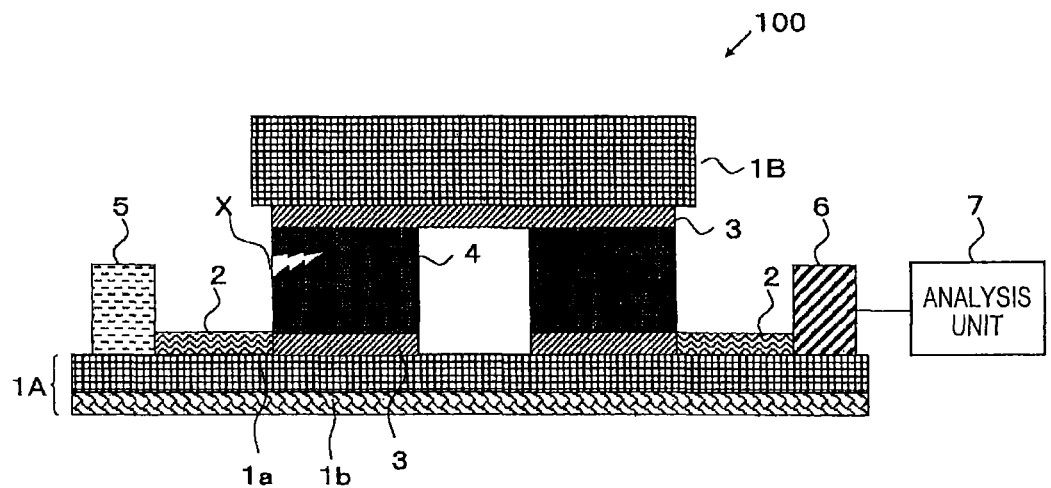
FIG. 1 is a schematic diagram of a semiconductor module according to the first embodiment.

A semiconductor module according to the first embodiment is explained by referring to FIGS. 1~11. FIG. 1 is a schematic diagram of a semiconductor module 100 according to the first embodiment.

The semiconductor module 100 includes a substrate 1, a first wiring 2 disposed on the substrate 1, an electrode pad 3 connected to the first wiring 2, a junction 4 (having an impedance Z1) disposed on the electrode pad 3, an oscillator 5 disposed in contact with the first wiring 2 and oscillating an electric (voltage) pulse wave (Hereinafter, it is called an input pulse wave) toward the junction 4 via the first wiring 2, and a detector 6 detecting an output wave of the input pulse wave from the junction 4.

When a characteristic impedance of the first wiring is Z0 and an impedance of the junction 4 is Z1, Z0 and Z1 have a relationship as following equation (1).

$$\left\| \frac{Z0 - Z1}{Z0} \right\| \leq 0.05 \quad (1)$$

Briefly, when the characteristic impedance Z0 of the first wiring 2 is a reference, the impedance Z1 of the junction 4 is within a range 95%~105% thereof. If the impedance Z1 is over the range, an output wave of the input pulse wave cannot be suitably detected. As a result, an indication of breakdown is hard to be detected.

(The Substrate)

As the substrate 1, for example, a regular print substrate or a ceramic substrate can be used. Concretely, it may be a dielectric substrate plate having an insulating layer (such as a glass epoxy resin or a ceramic material) and a conductive foil (such as a copper wiring).

(The First Wiring)

The first wiring 2 is disposed on a surface of the substrate 1. As the first wiring 2, a copper wiring can be used.

(The Electrode Pad, the Junction)

The electrode pad 3 is connected to the first wiring 2. Furthermore, the junction 4 is connected to the electrode pad 3. As the electrode pad 3, for example, a copper or aluminum can be used.

As the junction 4, for example, a solder material, a sintered material of metallic nano particle, a conductive paste, a conductive resin, or a metallic wax material, can be used. Furthermore, the junction 4 can be connected to another substrate or electronic parts via another electrode pad 3.

As the junction 4, the first case of a thin film junction layer or a fine bonding unit for chip bonding to connect a chip electrode and a substrate electrode, the second case of a junction to connect a semiconductor package electrode and a substrate electrode, or the third case of a junction layer to connect a semiconductor module and a cooling structure (such as a heat spreader), can be applied.

(The Oscillator)

On the first wiring 2, the oscillator 5 to electrically oscillate an input pulse wave toward the junction 4 via the first wiring 2 is disposed. As the oscillator, a pulse wave by a driver IC including a transistor circuit, or a piezoelectric ceramics such as PZT (lead zirconate titanate), can be used. For example, the pulse wave is a wave to change from a low level voltage to a high level voltage. After changing from a low level to a high level or from a high level to a low level, overshooting, undershooting, or ringing may occur in the pulse wave. Furthermore, the pulse wave may be a trapezoid wave, a sine wave, a cosine wave, or a square wave.

(The Detector)

Figure 2:
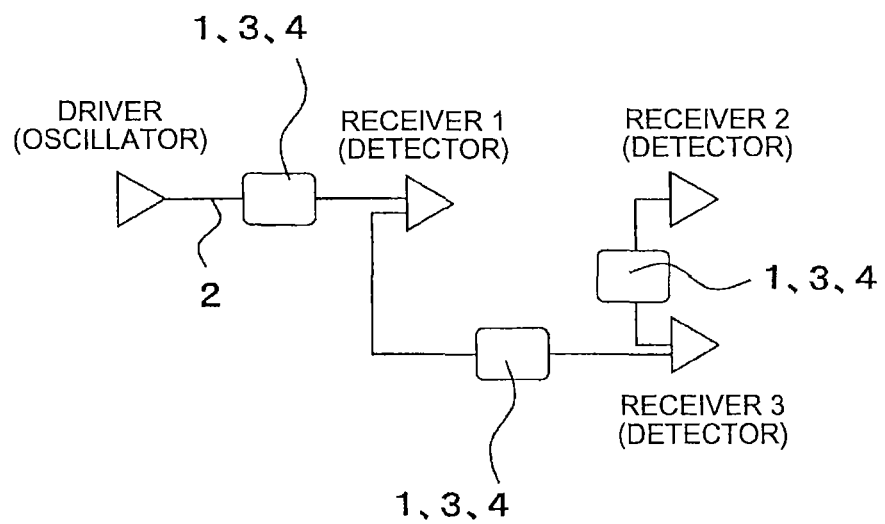
FIG. 2 is a block diagram of one example of a detector 6 in FIG. 1.

On the first wiring 2, the detector 6 to detect an output wave of the input pulse wave from the junction 4 is disposed. As the detector 6, a receiver IC including a transistor circuit can be used. Furthermore, if a plurality of junctions to be monitored as a target of breakdown-indication exists, a plurality of receivers as the detector is necessary. In this case, in order to avoid an output wave caused by divergence of wiring, a plurality of receivers may be connected by daisy chain wiring. An example that the plurality of receivers is connected by daisy chain wiring is shown in FIG. 2.

In order to prevent noises from the receiver IC, a termination may be performed. As the termination, a parallel resistance to insert a resistance (having a value equal to the characteristic impedance) in parallel with the receiver IC, a Thevenin termination having effect to reduce a power consumption, an AC parallel termination, a series termination to serially insert a resistance immediately after the driver, and a diode termination to cancel noises by a diode connecting to the receiver, are used.

Figure 3:
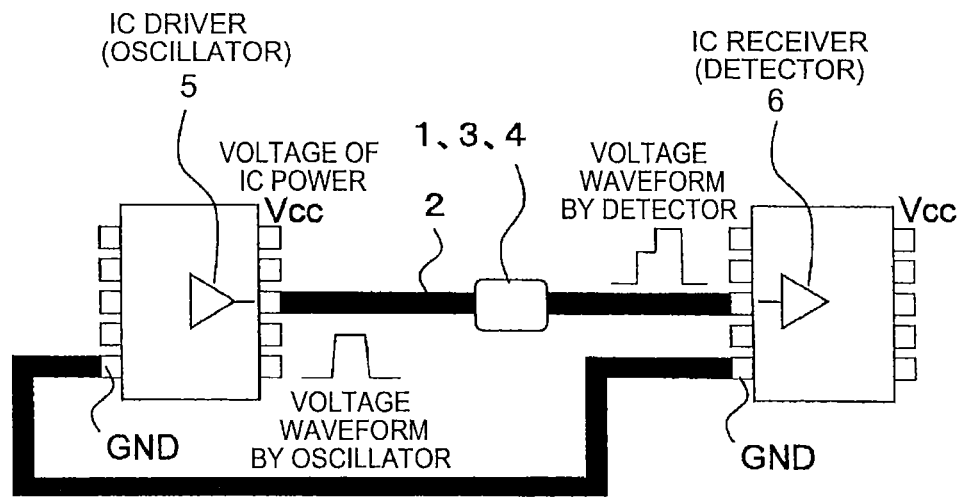
FIG. 3 is a block diagram of another example of the detector 6 in FIG. 1.

From a driver pin of the driver IC, an electric current (Hereinafter, it is called a current) flows through a loop, i.e., (a junction to be monitored as a target of breakdown-indication)→an inner circuit of IC→a grand pin of the receiver IC→a grand pattern→a grand pin of the driver IC→the inner circuit of IC. This component example is shown in FIG. 3.

(Microstrip, Stripline, Coplanar Waveguide)

As the first wiring 2 of the first embodiment, a microstrip, a stripline, or a coplanar waveguide, can be used.

The microstrip is a transmission line to transfer electromagnetic waves, having a structure that a linear conductive foil is formed on a surface of a dielectric substrate plate and a conductive foil is formed on the back face thereof. In the first embodiment, if the substrate 1 is a dielectric substrate plate having the back face on which the conductive foil is formed, the first wiring 2 is formed on the surface of the substrate 1 as the linear conductive foil. The microstrip has this structure as a transmission line to transfer electromagnetic waves.

The stripline is a transmission line to transfer electromagnetic waves, having a structure that a linear conductive foil is formed on both faces (surface and back face) of a dielectric substrate plate and a conductive foil is formed inside thereof. In the first embodiment, if the substrate 1 is a dielectric substrate plate having both faces on which the conductive foil is formed, the first wiring 2 is formed inside the substrate 1 as the linear conductive foil. The stripline has this structure as a transmission line to transfer electromagnetic waves.

The coplanar waveguide is a transmission line which a central conductor and an earthing conductor are formed on the same face of a dielectric substrate. In the first embodiment, the first wiring 2 is the central conductor as a transmission line to transfer electromagnetic waves.

For example, as to the microstrip, the characteristic impedance Z0 is suitably designed and manufactured so as to satisfy a following equation (2). In the same way, the stripline and the coplanar waveguide can be designed and manufactured.

$$w/h \leq 1 \ldots Z0 = \frac{60}{\sqrt{e_{eff}}} \ln\left(\frac{8h}{w_e} + 0.25\frac{w_e}{h}\right) \qquad (2)$$

$$w/h \geq 1 \ldots Z0 = \frac{120\pi}{\sqrt{e_{eff}}} \left[\frac{w_e}{h} + 1.393 + 0.667\ln\left(\frac{w_e}{h} + 1.444\right)\right]^{-1}$$

$w_e$ IS REPRESENTED AS FOLLOWS $$w/h \leq 1/2\pi \ldots w_e = w + \frac{1.25t}{\pi}\left(1 + \ln\left(\frac{4\pi w}{t}\right)\right)$$

$$w/h \geq 1/2\pi \ldots w_e = w + \frac{1.25t}{\pi}\left(1 + \ln\left(\frac{2h}{t}\right)\right)$$

EFFECTIVE PERMITTIVITY $e_{eff}$ IS REPRESENTED AS FOLLOWS $$e_{eff} = \frac{\varepsilon_r + 1}{2} + \frac{\varepsilon_r - 1}{2} F\left(\frac{w}{h}\right) - \frac{\varepsilon_r - 1}{4.6} \frac{t/h}{\sqrt{w/h}}$$

$$w/h \leq 1 \ldots F\left(\frac{w}{h}\right) = \left(1 + 12\frac{h}{w}\right)^{-1/2} + 0.04\left(1 - \frac{w}{h}\right)^2$$

$$w/h \geq 1 \ldots F\left(\frac{w}{h}\right) = \left(1 + 2\frac{h}{w}\right)^{-1/2}$$

Figure 4:
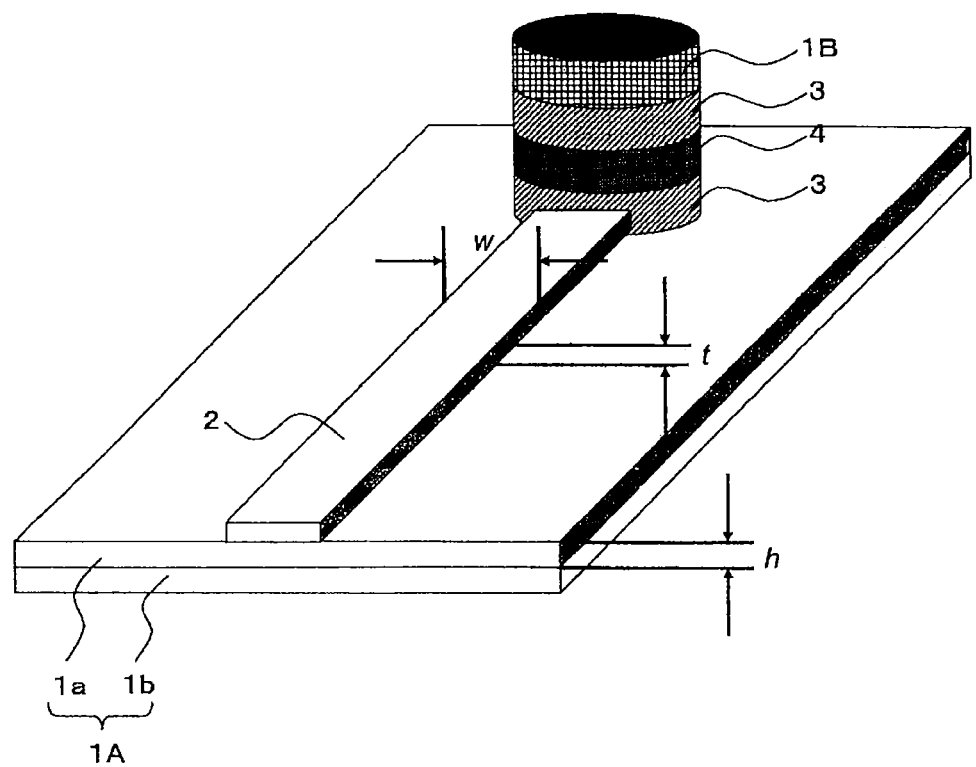
FIG. 4 is a schematic diagram of the semiconductor module having a microstrip according to the first embodiment.

Here, "$\varepsilon_r$" is a effective permittivity of an isolated material 1a of the substrate 1. "h" is a thickness of the isolated material 1a between a conductive foil 1b (the second wiring) disposed on the substrate 1 (nearest to the first wiring 2) and the first wiring 2. "W" is a width of the first wiring 2. "t" is a thickness of the first wiring 2. This component example is shown in FIG. 4.

In this way, if the microstrip or the stripline is used as the first wiring 2, a relationship of the equation (2) can be simply satisfied. Furthermore, the first wiring 2, the electrode pad 3 and the junction 4 are mechanically direct-connected. Accordingly, loss of input/output of the input pulse wave is few. As a result, existence/non-existence of crack X occurred at the junction 4 or a spread status thereof can be accurately detected.

(Capacitor, Coil)

When a regular copper wiring is used as the first wiring 2, a capacitor or a coil can be inserted between the first wiring 2 and the electrode pad 3. In case of the capacitor, the characteristic impedance Z0 is adjusted by capacitance effect. In case of the coil, the characteristic impedance Z0 is adjusted by inductance effect.

In this way, when the capacitor or the coil is inserted between the first wiring 2 and the electrode pad 3, by changing a capacity of the capacitor or an inductance of the coil, the characteristic impedance Z0 can be adjusted.

(The Analysis Unit)

Figure 5:
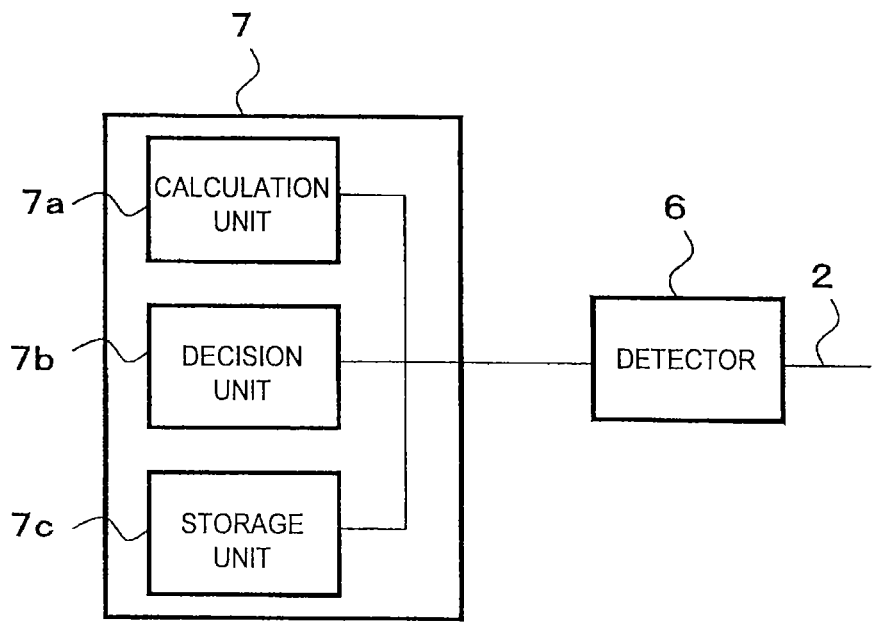
FIG. 5 is a block diagram of one example of an analysis unit 7 in FIG. 1.
Figure 6:
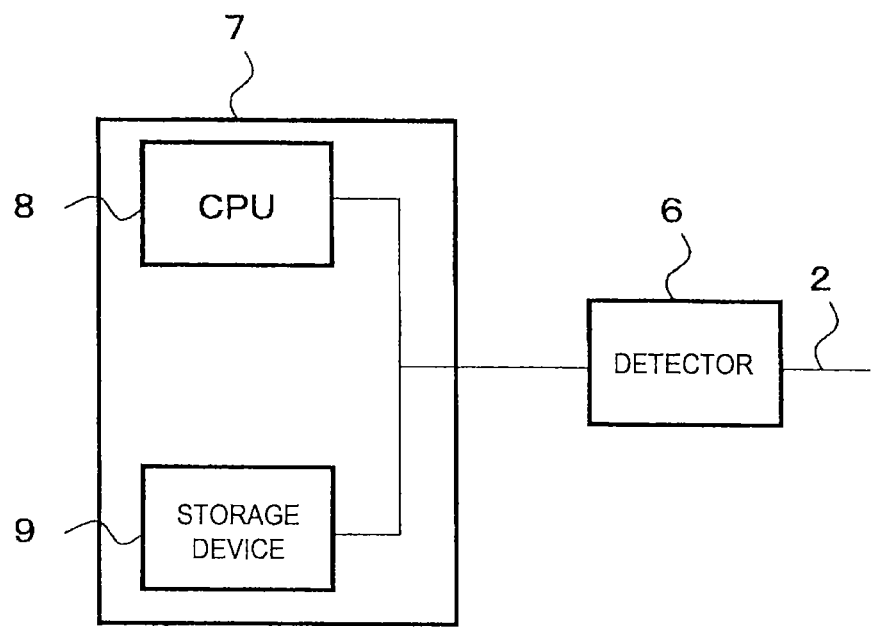
FIG. 6 is a block diagram of another example of the analysis unit 7 in FIG. 3.

The analysis unit 7 is explained by referring to FIGS. 5~6.

The analysis unit 7 is connected to the detector 6. As shown in FIG. 5, the analysis unit 7 includes a calculation unit 7a, a decision unit 7b and a storage unit 7c. The calculation unit 7a performs a predetermined calculation for a signal of the impedance Z1 acquired from the detector 6. The decision unit 7b decides existence/non-existence of a crack X at the junction 4 or a spread status thereof from a calculation result by the calculation unit 7a. The storage unit 7c stores a table related to a ratio of crack area and a voltage range of the signal. Furthermore, the analysis unit 7 may store a signal from the detector 6, a calculation result by the calculation unit 7a, and a decision result by the decision unit 7b. As shown in FIG. 6, the analysis unit 7 may be composed by replacing the calculation unit 7a and the decision unit 7b with a central processing unit (CPU) 8, and the storage unit 7c with a storage device 9 (such as a memory or a HDD). Moreover, if the oscillator is not a driver IC but oscillated with an analog signal, and if calculation/decision of the signal is performed using a digital signal, an AD converter (not shown in FIG.) to convert an analog signal (from the detector 6) into a digital signal may be inserted between the detector 6 and the analysis unit 7.

(Analysis Method)

The analysis unit 7 executes following signal processing and operation. As a result, existence/non-existence of the crack X at the junction 4 or a spread status thereof can be suitably detected, and an indication of breakdown can be presented. Hereinafter, a method for previously detecting probability of breakdown is explained by referring to FIG. 7.

(Preparation Step: S00)

A table is created in correspondence with a ratio of crack area, a voltage range, and a count value "Nc" to decide "crack-existence". One example of the table is shown in FIG. 8.

Assume that a section area of the junction 4 before a crack occurs is S1 and a crack area after the crack has occurred is S2. The ratio of crack area is S2/S1. Here, as the section area S1 of the junction and the crack area S2, a projection area can be respectively used.

Figures 8, 9:
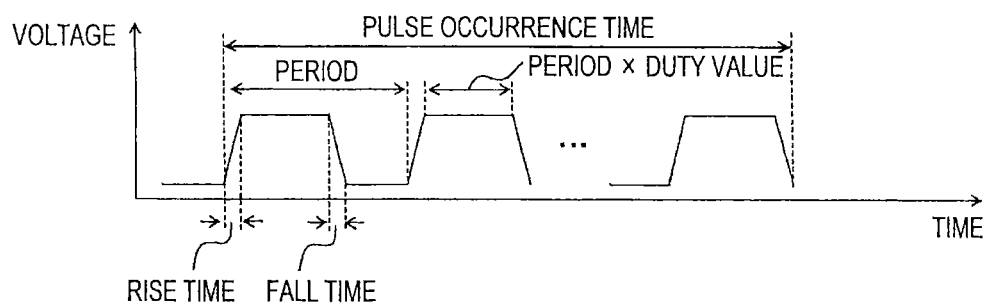
FIG. 8 is one example of a relationship table according to the first embodiment.
FIG. 9 is one example of a pulse wave oscillated from an oscillator 5 in FIG. 1.
Figure 10A:
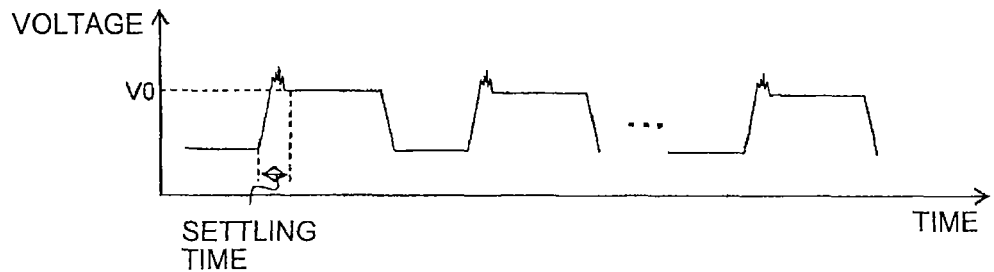
FIG. 10A, 10B, 10C and 10D are examples of voltage waveforms of an output wave according to the first embodiment.
Figure 10B:
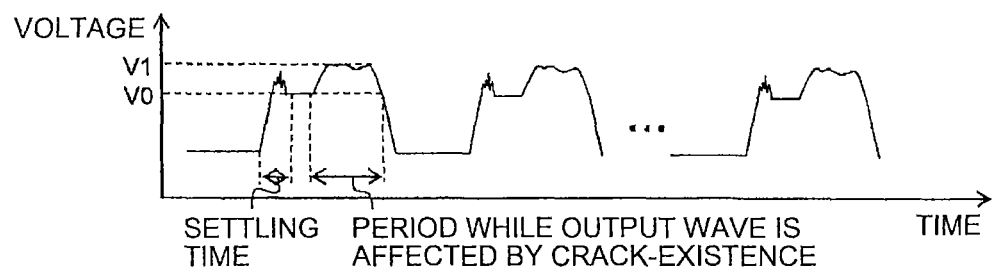
Figure 10C:
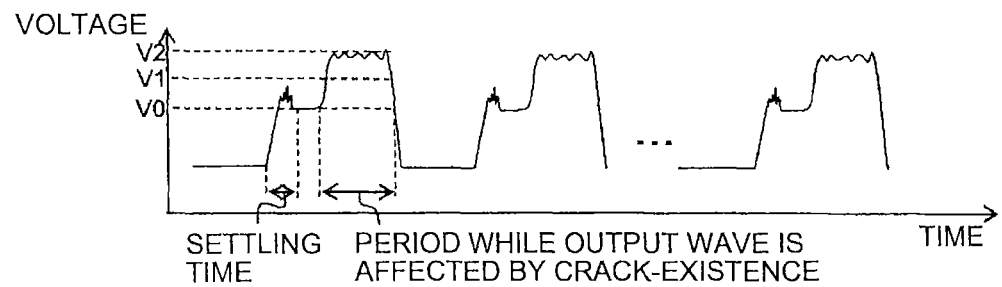
Figure 10D:
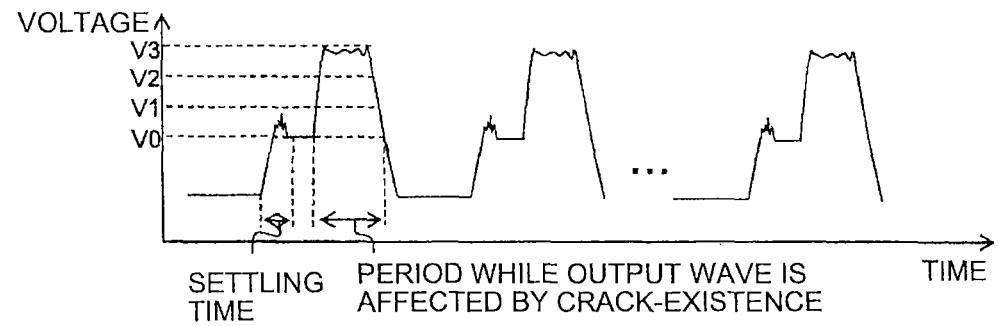

In the table of FIG. 8, the ratio of crack area is segmented into 0, 0~10%, 10~20%, and 20~30%. Here, the ratio "0" of crack area represents that the crack has not occurred.

The voltage range is a range of a voltage value (detected by the detector 6) segmented in proportion to the ratio of crack area at the junction. As a result, from the voltage value detected by the detector 6, existence/non-existence of crack X or a spread status thereof can be detected. In the table of FIG. 8, the voltage range is previously determined based on the ratio of crack area. Briefly, a voltage range corresponding to the ratio "0%" of crack area is below V0. In the same way, a voltage range corresponding to the ratio "0~10%" of crack area is V0~V1, a voltage range corresponding to the ratio "10~20%" of crack area is V1~V2, and a voltage range corresponding to the ratio "20~30%" of crack area is V2~V3.

The count value "Nc" to decide "crack-existence" is, when the number of count of a voltage value V (detected by the detector 6) is above "Nc" corresponding to a voltage range, a threshold to decide that at least a crack having the ratio of crack area corresponding to the voltage range has occurred.

For example, in the table of FIG. 8, the count value "Nc" corresponding to V0~V1 is 30. This means, in one pulse occurrence time, when a voltage value V (V0≤V) is detected (by the detector 6) over thirty times, at least a crack having the ratio "0~10%" of crack area has occurred. The count value "Nc" is set to prevent decision-error caused by noise or detection-error. Moreover, an occurrence probability may be used instead of the number of count Nc.

Figure 7:
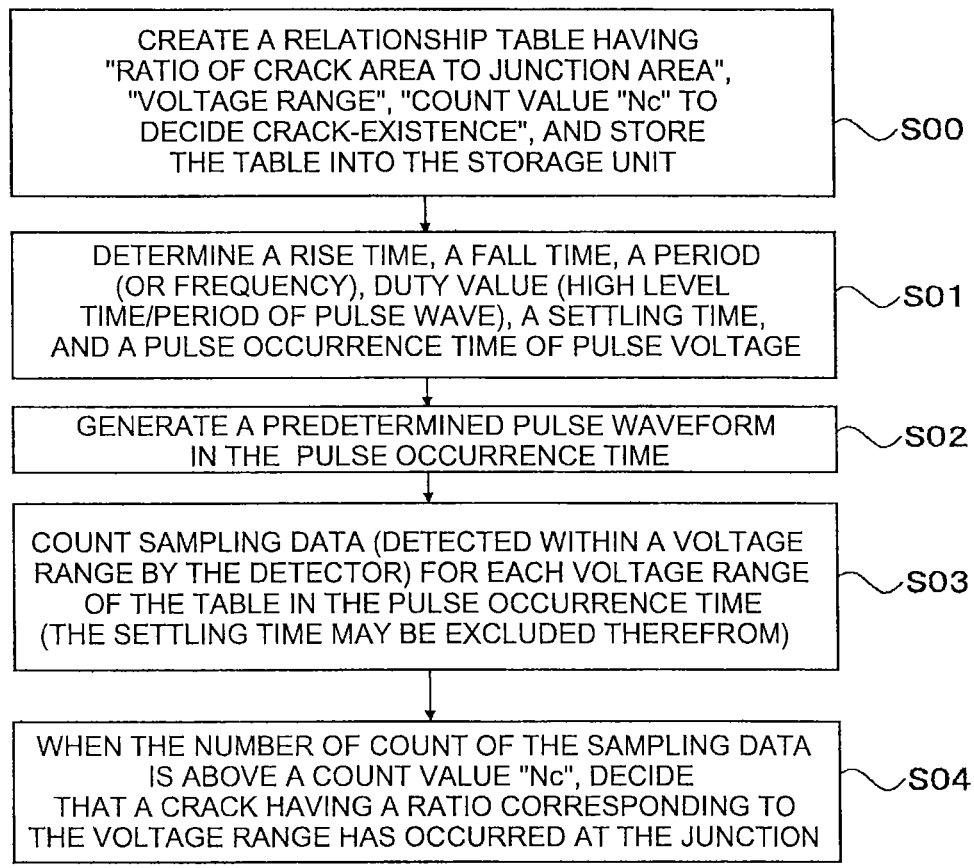
FIG. 7 is a flow chart of a method for detecting an indication of breakdown according to the first embodiment.

By preparing the table shown in FIG. 8, the table can be previously stored into the storage unit 7c in FIG. 7.

(The First Step: S01)

As to a pulse voltage to be occurred, a rise time, a fall time, a period (or a frequency), a duty value (high level time/period of pulse wave), a settling time (signal transient time, i.e., a period having unstable voltage change such as immediately after change of pulse voltage, a rise, a fall, a ringing), and a pulse occurrence time, are determined.

(The Second Step: S02)

By a condition determined at the first step (S01), the oscillator 5 generates pulse waves during the pulse occurrence time. One example of pulse waves oscillated from the oscillator 5 is shown in FIG. 9. This pulse wave may be a clock signal by the driver IC.

(The Third Step: S03)

The detector 6 detects a voltage value V of the output wave. Examples of the output wave are shown in FIGS. 10A~10D.

During the pulse occurrence time (the settling time may be excluded therefrom), as to the voltage range in the table (created at the preparation step (S00)), the analysis unit 7 counts the number of sampling data (signal of voltage value V) detected within the voltage range. Hereinafter, the number of sampling data counted by the analysis unit 7 is called the number of count.

(The Fourth Step: S04)

When the number of count (counted by the analysis unit 7) is above the count value "Nc", the analysis unit 7 decides that at least a crack having the ratio of crack area corresponding to the voltage range has occurred at the junction 4.

Figure 11:
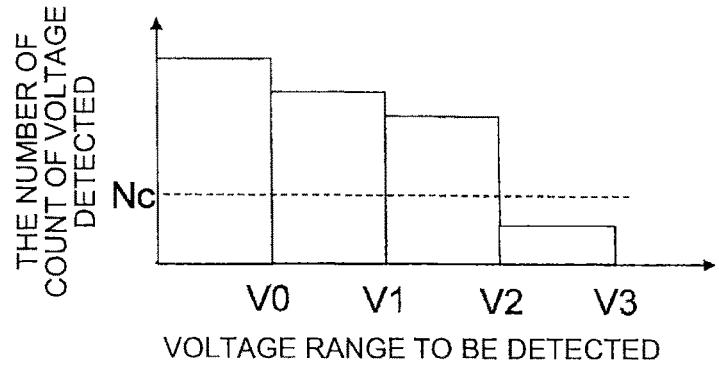
FIG. 11 is one example of the number of count of a voltage detected within each voltage range according to the first embodiment.

This situation is explained by referring to FIG. 11. In FIG. 11, the number of count corresponding to the voltage range V~V2 is above the count value "Nc". However, the number of count corresponding to the voltage range V2~V3 is below the count value "Nc". In this case, by referring to the table of FIG. 8, it is decided that a crack having the ratio "0.1~0.2" of crack area has occurred.

Moreover, by specially measuring a temperature, the detector 6 may change the voltage range (to decide existence/non-existence of crack) based on the temperature, and correct the output wave based on change of the temperature.

According to the first embodiment, when a crack X occurs at the junction 4 and spreads, an electric load of the junction 4 changes. Briefly, a wave partially reflected from the junction 4 is superimposed on a pulse wave and passing through the junction 4. Accordingly, a waveform of an electric signal is transformed. As a result, in comparison with the case that the crack X does not occur, an output wave of the crack X is superimposed, and the output signal has a characteristic waveform.

The situation that the crack X spreads is explained by referring to FIGS. 10A~10D. In proportion to spread of the crack X, the output wave changes as FIG. 10A→FIG. 10B→FIG. 10C→FIG. 10D. Briefly, when spread of the crack X is larger, a voltage value observed in "a period while the output wave is affected by existence of the crash X" is gradually larger as shown in V0 of FIG. 10A→V1 of FIG. 10B→V2 of FIG. 10C→V3 of FIG. 10D.

By taking notice of this phenomenon, change of the electric waveform caused by existence/non-existence of the crack X is detected and monitored. As a result, a semiconductor module including a component/system to evaluate breakdown-indication of the junction 4 can be provided.

[The First Modification of the First Embodiment]

Figure 12:
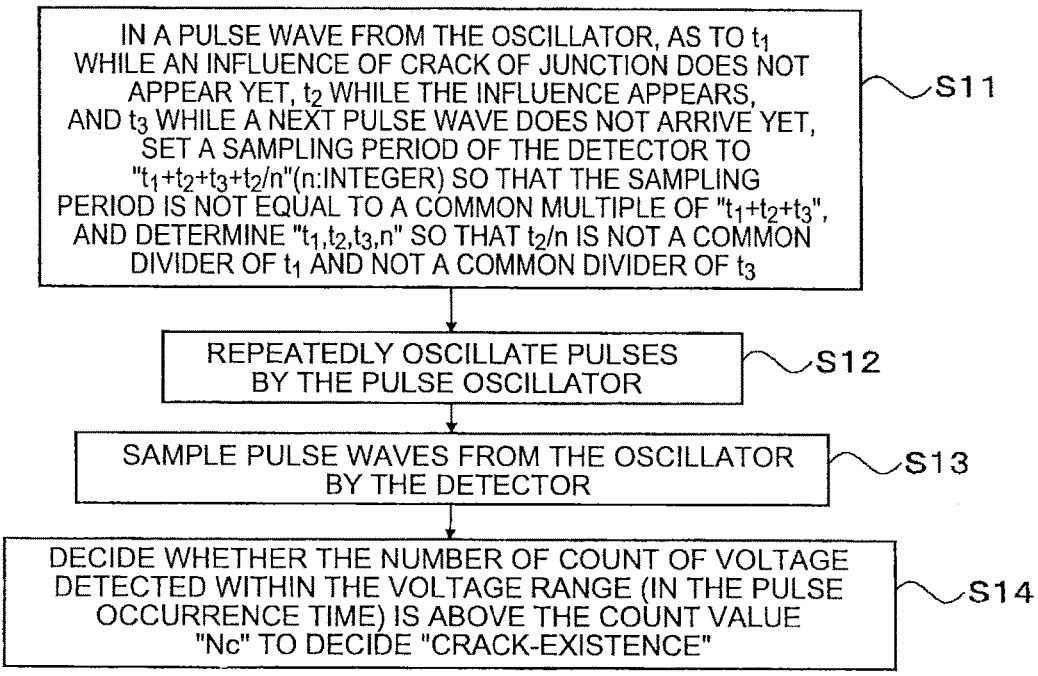
FIG. 12 is a flow chart of a method for detecting an indication of breakdown according to a first modification of the first embodiment.

In the case that a sampling frequency of the detector 6 is lower than a frequency of an oscillation pulse signal, a method for deciding existence/non-existence of crack is explained by referring to FIG. 12.

(The Eleventh Step: S11)

Figure 13:
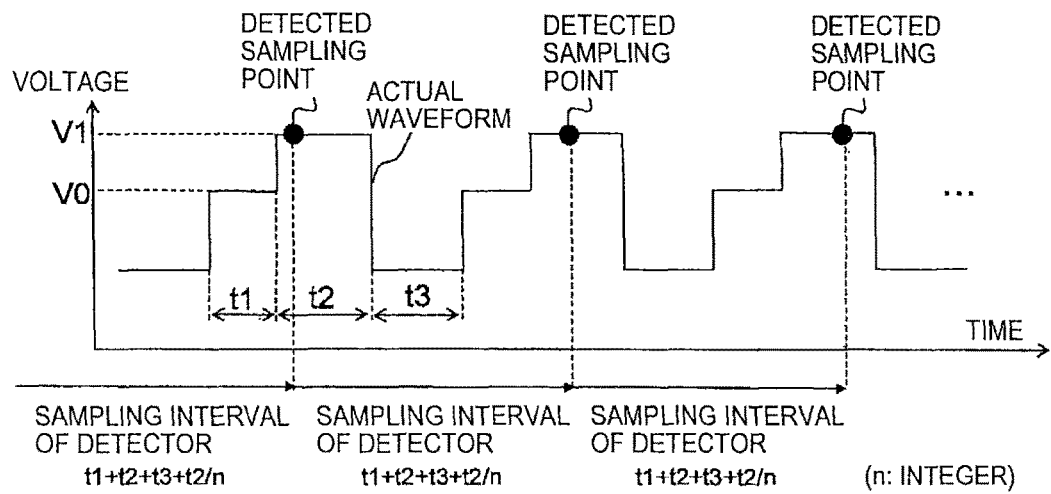
FIG. 13 is one example of a voltage waveform of an output wave according to the first modification of the first embodiment.

Assume that in a pulse wave from the oscillator 5, a period while an influence of a crack at the junction 4 does not appear yet (from start timing of the pulse wave) is "t1", a period while the influence appears (after "t1") is "t2", and a period while a next pulse wave does not arrive yet (after "t2") is "t3". In this case, a sampling interval of the detector 6 is set to "t1+t2+t3+t2/n" (n: integer) so that the sampling interval is not equal to a common multiple of "t1+t2+t3". Furthermore, "t1", "t2", "t3" and "n" are determined so that "t2/n" is not a common divider of "t1" and not a common divider of "t3". This situation is shown in FIG. 13.

(The Eleventh Step: S12)

Under above-mentioned condition, the oscillator 5 repeatedly oscillates a pulse.

(The Thirteenth Step: S13)

The detector 6 detects a voltage value of the output wave. When a sampling frequency of the detector 6 is lower than a frequency of the oscillation pulse signal, the voltage value is dispersedly detected by the detector 6 as shown in black circles of FIG. 13. Here, under the condition of the eleventh step (S11), by counting a plurality of voltage values (black circles in FIG. 13) of the output wave in the pulse occurrence time, a timing of the detected sampling point (each black circle in FIG. 13) gradually shifts. As a result, data approximated to an actual waveform of the output wave can be acquired.

(The Fourteenth Step: S14)

By referring to the table, the analysis unit 7 decides whether the number of count (the number of sampling points) detected within a voltage range in the pulse occurrence time is above the count value "Nc" to decide "crash-existence".

By using above-mentioned process, even if a sampling frequency of the detector is lower than a frequency of the oscillation pulse signal, by repeatedly detecting the pulse signal (repeatedly oscillated), sampling data within the voltage range is detected. As a result, a voltage detected during the period t2 can be counted.

[The Second Modification of the First Embodiment]

Figure 14:
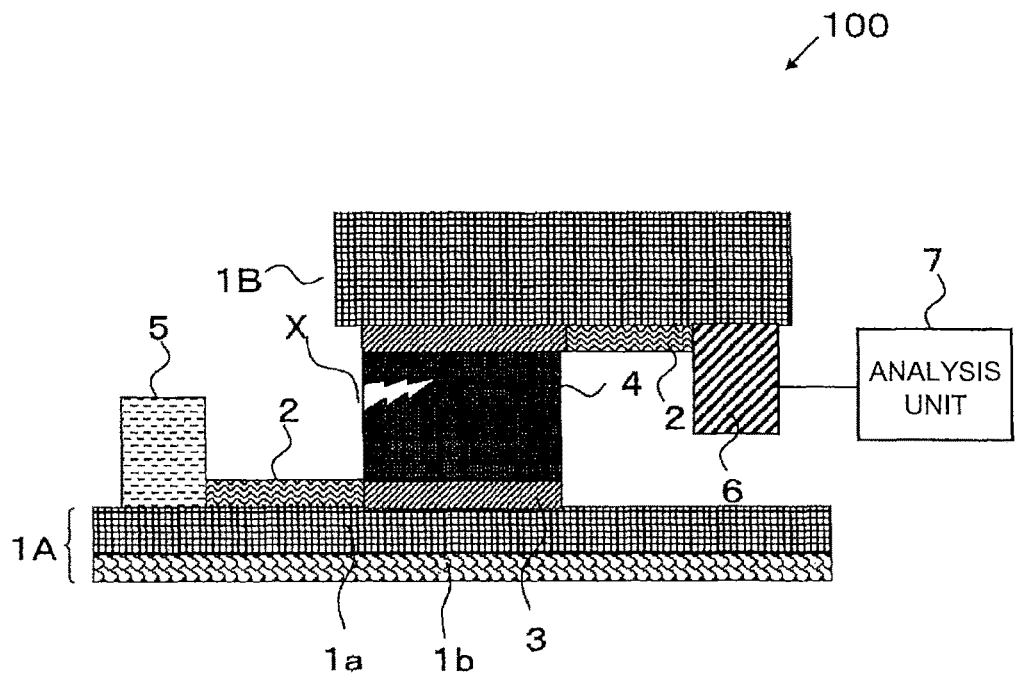
FIG. 14 is a schematic diagram of a semiconductor module according to a second modification of the first embodiment.

FIG. 14 is a schematic diagram of a semiconductor module according to the second modification of the first embodiment. In the first embodiment, as shown in FIG. 1, by using the first wiring 2 disposed on the substrate 1A, two junctions 4 put between two electrode pads 3 are electrically inserted between the oscillator 5 and the detector 6 in series.

On the other hand, in the second modification, as shown in FIG. 14, by using the first wiring 2 disposed on two substrates 1A and 1B, one junction 4 is put between two electrode pads 3. Briefly, the semiconductor module having one junction 4 is shown. According to the second modification, as to one junction 4, existence/non-existence of a crack X and a spread thereof can be estimated.

While certain embodiments have been described, these embodiments have been presented by way of examples only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor module comprising:
    a substrate;
    a first wiring disposed on the substrate;
    an electrode pad connected to the first wiring;
    a junction disposed between the electrode pad and another electrode pad, the junction being a material having an impedance within a predetermined range of a characteristic impedance of the first wiring,
    the first wiring, the electrode pad and the junction being mechanically direct-connected;
    an oscillator that oscillates a predetermined voltage signal toward the junction via the first wiring, the oscillator being connected to the first wiring;
    a detector that detects the predetermined voltage signal from the junction via the first wiring, the detector being connected to the first wiring; and
    an analysis unit that decides a crack area of the junction, based on an oscillation voltage signal of the first wiring oscillated by the oscillator, a voltage value of a detection voltage signal detected by the detector via the first wiring, and a table that stores a relationship among a ratio of the crack area to a section area of the junction, a voltage range including the voltage value of the detection voltage signal, and a predetermined count value of a number of times of occurrence of the voltage value within the voltage range during a predetermined pulse occurrence time,
    wherein the junction is electrically inserted between the oscillator and the detector via the first wiring,
    the oscillation voltage signal is a pulse wave signal,
    the voltage range and the predetermined count value are stored in correspondence with respective different values of the ratio in the table,
    the analysis unit makes the oscillator generate the oscillation voltage signal during the predetermined pulse occurrence time, and, when the number of times of occurrence of the voltage value within a voltage range in the table during the predetermined pulse occurrence time is larger than or equal to the predetermined count value corresponding to the voltage range in the table, decides the crack area based on a value of the ratio corresponding to the voltage range in the table.

2. The semiconductor module according to claim 1, wherein
    the predetermined count value in the table is a smaller value if the voltage value of the detection voltage signal is a larger value.

3. An electronic device on which the semiconductor module of claim 1 is loaded.

4. An electronic device on which the semiconductor module of claim 2 is loaded.

5. A method for deciding a crack area of a junction disposed between a first electrode pad and a second electrode pad, the first electrode pad being connected to a first wiring disposed on a substrate in a semiconductor module, the junction being a material having an impedance within a predetermined range of a characteristic impedance of the first wiring, the first wiring, the first electrode pad and the junction being mechanically direct-connected, the method comprising:
- oscillating, by an oscillator, a predetermined voltage signal toward the junction via the first wiring, the oscillator being connected to the first wiring;
- detecting, by a detector, the predetermined voltage signal from the junction via the first wiring, the detector being connected to the first wiring; and
- deciding the crack area of the junction, based on an oscillation voltage signal of the first wiring oscillated by the oscillator, a voltage value of a detection voltage signal detected by the detector via the first wiring, and a table that stores a relationship among a ratio of the crack area to a section area of the junction, a voltage range including the voltage value of the detection voltage signal, and a predetermined count value of a number of times of occurrence of occurrence of the voltage signal within a voltage range during a predetermined pulse occurrence time, wherein the junction is electrically inserted between the oscillator and the detector via the first wiring, the oscillation voltage signal is a pulse wave signal, the voltage range and the predetermined count value are stored in correspondence with respective different values of the ratio in the table, the deciding includes making the oscillator generate the oscillation voltage signal during the predetermined pulse occurrence time, and when the number of times of occurrence of the voltage value within a voltage range in the table during the predetermined pulse occurrence time is larger than or equal to the predetermined count value corresponding to the voltage range in the table, deciding the crack area based on a value of the ratio corresponding to the voltage range in the table.

6. The method according to claim 5, wherein the predetermined count value in the table is a smaller value if the voltage value of the detection voltage signal is a larger value.

7. An electronic device on which the semiconductor module of claim 5 is loaded.

8. An electronic device on which the semiconductor module of claim 6 is loaded.

* * * * *